(12) United States Patent
Azadet

(10) Patent No.: US 6,617,993 B1
(45) Date of Patent: Sep. 9, 2003

(54) ANALOG TO DIGITAL CONVERTER USING ASYNCHRONOUSLY SWEPT THERMOMETER CODES

(75) Inventor: Kameran Azadet, Middletown, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/414,129

(22) Filed: Oct. 8, 1999

(51) Int. Cl.[7] ................................................. H03M 1/56
(52) U.S. Cl. ........................................ 341/169; 341/120
(58) Field of Search ............................... 341/1, 118, 120, 341/61, 155, 143

(56) References Cited

U.S. PATENT DOCUMENTS

| | | | | |
|---|---|---|---|---|
| 4,768,016 A | * | 8/1988 | Chu et al. .................... | 340/347 |
| 4,940,982 A | * | 7/1990 | Gulczynski ................. | 341/169 |
| 5,682,163 A | * | 10/1997 | Hsu ........................... | 341/156 |
| 6,204,795 B1 | * | 3/2001 | Afghahi ...................... | 341/166 |

* cited by examiner

Primary Examiner—Brian Young
Assistant Examiner—Joseph Lauture
(74) Attorney, Agent, or Firm—Jean-Marc Zimmerman

(57) ABSTRACT

An A/D converter in which a thermometer code representing an increase in analog input voltage values is asynchronously derived using a chain of buffers, the thermometer code being translated using a binary code into a ramp voltage by a D/A converter and frozen when the ramp voltage equals the amplitude of a selected analog voltage being digitized.

21 Claims, 2 Drawing Sheets

ANALOG TO DIGITAL CONVERTER USING ASYNCHRONOUSLY SWEPT THERMOMETER CODES

FIELD OF THE INVENTION

The present invention relates to analog to digital (A/D) converters, and more particularly to an A/D converter in which an asynchronously swept thermometer code is used to perform the A/D conversion.

BACKGROUND OF THE INVENTION

Conventional A/D converters employing parallel architectures, such as flash converters, are widely used today in electronic circuits. In such converters an analog input signal is transformed into a digital binary thermometer code which is then translated into a binary code using a conversion table. The thermometer code is used to generate an analog ramp voltage whose value is compared to an analog input voltage to selectively determine when the analog to digital conversion occurs.

Conventional A/D converters of the type just described suffer from several drawbacks. First, they typically employ a high speed clock which requires several clock cycles, and thus a relatively lengthy period of time, to synchronously sample the signal to be digitized before the analog to digital conversion occurs. Second, such converters also typically employ a plurality of voltage comparators for comparing the analog input voltage to a plurality of uniformly spaced reference voltages. These comparators are relatively complex, occupying a large surface area and consuming a great deal of power. Finally, the random offsets of the voltage comparators introduce nonlinearity into the A/D conversion which impedes the accuracy at which conversion occurs at a selected analog input voltage.

SUMMARY OF THE INVENTION

An A/D converter employs a chain of buffers to generate an asynchronously swept thermometer code that is used to derive a ramp voltage that is compared with an input voltage to selectively determine a voltage at which D/A conversion occurs. When the ramp voltage equals the input voltage, the thermometer code existing at that time is 1) frozen by halting the propagation of bits through the buffers and 2) translated into a binary code using a conversion table to determine the amplitude of the digitized voltage.

Advantageously, use of the chain of buffers enables the thermometer code to be swept at a frequency that is lower than the frequency used in conventional A/D converters. Further advantageously, the use of single voltage comparator requires less power than conventional A/D converters, and it does not introduce nonlinearily into the A/D conversion so that an improved conversion resolution is attained compared to conventional A/D converters.

DETAILED DESCRIPTION OF THE INVENTION

Figure 1:
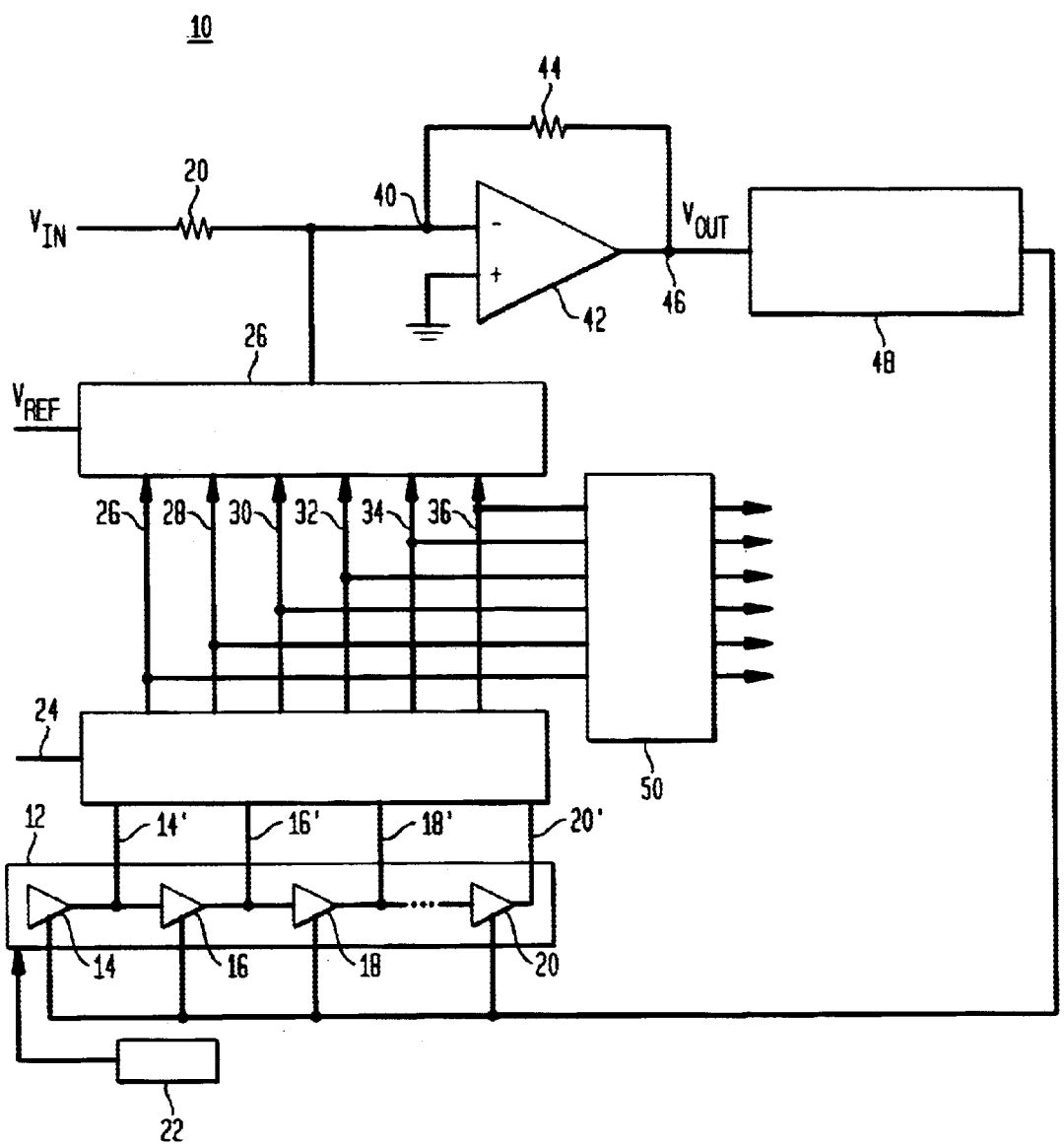
FIG. 1 shows a first exemplary embodiment of an A/D converter using swept thermometer codes according to the present invention.

FIG. 1 shows a first exemplary embodiment of an of an A/D converter using swept thermometer codes according to the present invention. A/D converter 10 employs a chain 12 of buffers 14, 16, 18 . . . n to generate a gradually increasing thermometer code from which a binary code is derived. This binary code is used to generate an analog ramp voltage which is compared with an analog input voltage $V_{IN}$ that is to be digitized. $V_{IN}$ is applied across a resistor 20. When the analog ramp voltage equals a selective $V_{IN}$, the thermometer code is stopped so that it no longer increases and it is translated into a binary code representing the amplitude of the digitized voltage into which the analog input voltage is converted.

The thermometer code is generated by 1s propagating through buffer chain 12. At each reset pulse generated by a dock 22, buffers 14 . . . n are reset to 0. When the reset pulse terminates, a logic 1 is loaded into buffer 14 and propagates in succession through the other buffers in chain 12 to generate a thermometer code. The outputs of buffers 14, 16, 18 . . . n that constitute the thermometer code are input to a conversion table 24 via leads 14', 16', 18' . . . n' which translates the thermometer code into a binary code having six bits that are then input to a D/A converter 26 via leads 28, 30, 32, 34, 36 and 38, respectively. The binary code is then converted by D/A converter 26 into a ramp voltage having a resolution of 64, i.e. 2⁶, amplitude levels since the binary code has six bits. Thus, A/D converter 10 uses 64 buffers, The code need not have six bits, but can instead have any selective number of bits that enable the maximum number of buffers used, i.e., n, to generate the code. The conversion table 24 for translating the thermometer code into a binary code, and the D/A converter 26 coupled to the conversion table 25 for converting the binary code into the ramp voltage constitute a translator.

The ramp voltage at the output of D/A converter 26 is input into an inverting input 40 of an operational amplifier 42. A resistor 44 is coupled between inverting input 40 and an output voltage $V_{OUT}$ 46 of amplifier 42. $V_{IN}$ and the ramp voltage at the output of D/A converter 26 are then combined to cause output 46 of amplifier 42 to change from negative to positive when the value of the ramp crosses the value of $V_{IN}$. A single voltage comparator 48 coupled to output 46 of amplifier 42 produces a +1 when input 40 is less than zero or negative, and a −1 when input 40 is greater than zero or positive. This change from +1 to −1 occurs at the crossover of the ramp voltage from D/A converter 26 and $V_{IN}$. Reference voltage $V_{REF}$ supplies the maximum amplitude of $V_{IN}$ to D/A converter 26.

The output of voltage comparator 48 is coupled to buffers 14, 16, 18 . . . n, respectively such that when the output of comparator 48 changes to −1, buffers 14, 16, 18 . . . n are frozen so that the 1s do not propagate farther down buffer chain 12. The bits on leads 28, 30, 32, 34, 36 and 38 are coupled to the inputs of a latch 50 and appear at the outputs of latch 50 at the next clock pulse. These bits are the digital representation of the selected value of $V_{IN}$ at which D/A converter 26 converts the analog signal to a digital signal.

A/D converter 10 provides improved resolution in performing analog to digital conversion at a specific $V_{IN}$ compared to conventional A/D converters. However, this improvement in resolution is attained at the cost of an increase in the amount of time required to do so since more buffers have to be used to generate the thermometer code for conversion. In addition, by using single voltage comparator 48, A/D converter 10 uses less power and also introduces less nonlinearity into the A/D conversion then conventional A/D converters.

Figure 2:
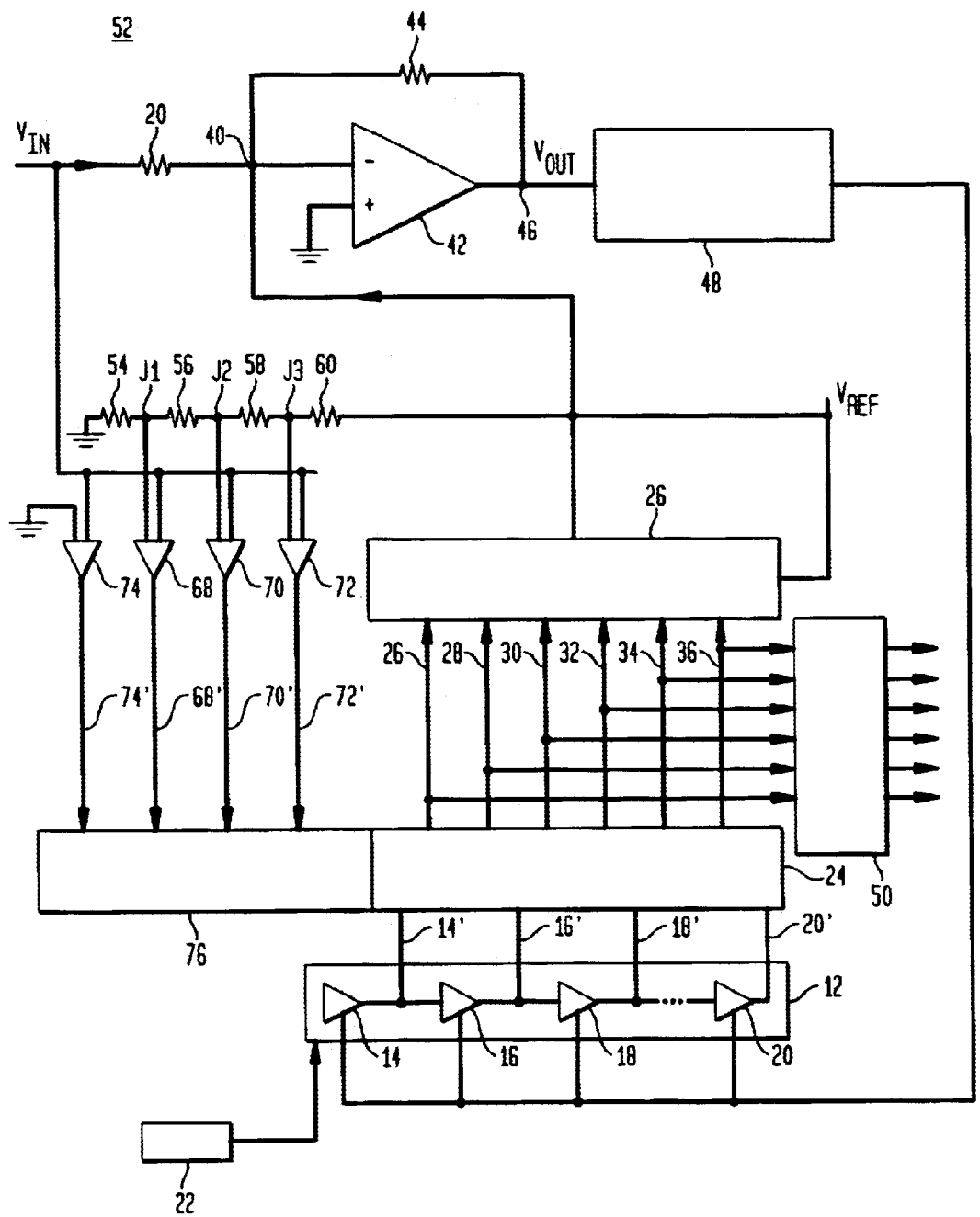
FIG. 2 shows a second exemplary embodiment of an A/D converter using swept thermometer code s according to the present invention.

FIG. 2 shows a second embodiment of an A/D converter 52 using asynchronously swept thermometer codes according to the present invention. A/D converter 52 provides improved resolution compared to conventional A/D converters without the corresponding increase in conversion time associated with A/D converter 10. Like A/D converter 10, it is assumed that A/D converter 52 uses a six bit binary code. For purposes of simplification, components of A/D converter 52 shown in FIG. 2 having the same function as those of A/D converter 10 shown in FIG. 1 are designated using the same numbers.

A/D converter 52 attains an improved resolution by dividing the maximum amplitude of $V_{IN}$ over which A/D converter 52 is designed to operate into a predetermined number of voltage ranges between zero and a selected maximum voltage. If, for example, $V_{in}$ is in a third range, coarse comparators can be used to provide a nearly instantaneous indication that the amplitude of the voltage ramp has attained a value at least as large as the upper limit of the second range at which conversion can occur. Thus, unlike device 10, device 52 does not require that the 1s propagate through all of the buffers in buffer chain 12 in order for conversion to occur.

$V_{REF}$ supplies the maximum amplitude of $V_{IN}$ to D/A converter 26 and is applied to series resistors 54, 56, 58 and 60 coupled between $V_{REF}$ and ground. If these resistors have equal values, the junctions J1, J2 and J3 will be at 25%, 50% and 75% of $V_{ref}$ and D/A converter 52 uses 16 buffers, i.e., 64 bits/4 voltage ranges. Junctions J1, J2 and J3 are respectively coupled by leads 62, 64 and 66 to the inputs of coarse comparators 68, 70 and 72. The corresponding input of a fourth coarse comparator 74 is coupled to ground.

When $V_{IN}$ is in the lowest quarter, i.e., 25%, range, comparator 74 outputs a 1 and a plurality of coarse comparators 68, 70 and 72 output 0s. If $V_{in}$ exceeds the voltage at any of the junctions J1, J2 or J3, the coarse comparator to which they are connected outputs a 1. Thus, for example, if $V_{IN}$ lies at 30% of $V_{REF}$, i.e., between 25% and 50%, comparators 68 and 74 output 1s and comparators 70 and 72 output 0s.

The outputs of coarse comparators 68, 70, 72 and 74 are coupled to a conversion table 76 via leads 68', 70', 72' and 74', and the outputs of a chain 12 of buffers 14, 16, 18 . . . n are coupled to conversion table 24 via leads 14', 16', 18' . . . n'. At each pulse of a clock a reset pulse is generated. When the pulse terminates, a logic 1 loaded into first buffer 14 propagates through buffer chain 12. In alternative embodiments of the present invention not shown, different numbers of both comparators and buffers can be used than are employed in A/D converter 52.

Conversion table 76 converts the outputs of coarse comparators 68, 70, 72 and 74 and the outputs of buffers 14, 16, 18 . . . n into a binary digital code that is input via leads 28, 30, 32, 34, 36 and 38 to D/A converter 26. More specifically, conversion table 76 provides a binary digital code representing the sum of the values of the outputs of coarse comparators 68, 70, 72 and 74 and the outputs of buffers 14, 16, 18 . . . n. When the analog ramp voltage at the output of D/A converter 26 equals the voltage of $V_{IN}$, primary comnparator 44 outputs a −1 that freezes buffers 14, 16, 18 . . . n. Leads 28, 30, 32, 34, 36 and 38 are coupled to latch 50 and on the next clock pulse the code on these leads is transferred to the outputs of latch 50 as the binary digital code for $V_{IN}$.

To further improve the resolution of an A/D conversion, a multi-stage A/D converter can be fabricated using a plurality of A/D converters 10 or 52 which are cascaded together. In such a multi-stage A/D converter, $V_{OUT}$ from a first stage is amplified and input into an identical second stage, or alternatively, $V_{OUT}$ is input without first being amplified into a second stage having a smaller $V_{REF}$ and thus a finer resolution then the first stage. Since the complexity of an A/D converter increases exponentially as the number of bits being converted increases, i.e., larger numbers of buffers are required to convert larger numbers of bits, it is advantageous to use an A/D converter employing a multi-stage architecture for converting a large number of bits, wherein each stage converts a fraction of the entire number of bits to be converted. This results in a device being implemented that is faster and uses less power to convert the bits then a single stage device A/D converter.

Numerous modifications to and alternative embodiments of the present invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claims is reserved.

What is claimed is:

1. An A/D converter comprising:
    a code generator for generating an increasing thermometer code, the code generator including a chain of buffers;
    a translator that translates said thermometer code into a ramp voltage; and
    a comparator for comparing the ramp voltage to an analog input voltage and providing a signal when the ramp voltage equals a specified analog input voltage, said signal causing the thermometer code to be frozen, wherein the frozen thermometer code represents the digitized amplitude of the analog voltage.

2. The A/D converter according to claim 1, wherein the translator includes a conversion table for translating the thermometer code into a binary code, and a D/A converter coupled to the conversion table for converting the binary code into the ramp voltage.

3. The A/D converter according to claim 1, further including reset means for periodically resetting the code generator.

4. The A/D converter according to claim 1, wherein the code generator further includes a signal indicator for indicating which one of a plurality of voltage ranges are exceeded by the analog voltage.

5. The A/D converter according to claim 4, wherein the signal indicator comprises:
    a voltage divider coupled between a maximum possible value of the analog voltage and a minimum possible value of the analog voltage, the voltage divider having a plurality of outputs; and
    a plurality of comparators having first inputs coupled to a terminal at which the analog input voltage is applied and having second inputs coupled to the outputs of the voltage divider.

6. The A/D converter according to claim 1, wherein the minimum possible value of the analog voltage is ground.

7. The A/D converter according to claim 1, wherein the comparator comprises:
    an operational amplifier having an inverting input, a non inverting input and an output, a combination of the analog voltage and the ramp voltage being applied to the inverting input; and
    a primary comparator coupled to the output of the operational amplifier.

8. An A/D converter, comprising:

an operational amplifier having an inverting input, a non-inverting input and an output;

a first resistor couple between a terminal to which an analog input voltage to be digitized is applied and the inverting input;

a second resistor coupled between the inverting input and output of the operational amplifier;

a comparator coupled to the output of the amplifier;

a chain of buffers, wherein a logic 1 is loaded into a first buffer of the buffer chain;

reset means for periodically resetting the chain of buffers to logic O outputs;

a conversion table coupled to the outputs of the buffers for translating the logic 1s in the buffers into a binary digital code; and a D/A converter coupled to the conversion table to receive and translate the binary digital code into a ramp voltage, the ramp voltage being input into the inverting input of the operational amplifier device for generating a digitized representation of the input voltage.

9. An A/D converter comprising:

a means for generating an increasing thermometer code, the code generating means including a chain of buffers;

a means for translating said thermometer code into a ramp voltage; and a means for comparing the ramp voltage to an analog input voltage and providing a signal when the ramp voltage equals a specified analog input voltage, said signal causing the thermometer code to be frozen, wherein the frozen thermometer code represents the digitized amplitude of the analog voltage.

10. An A/D converter, comprising:

indication means for indicating which one of a plurality of consecutive voltage ranges are exceeded by an analog input voltage;

a chain of buffers;

loading means for loading a logic 1 into a buffer at one end of the buffer chain;

reset means for periodically resetting the buffers so that logic 0s are output from the buffers and for enabling the logic 1 loaded in the buffer to propagate through the other buffers in the buffer chain;

ramp voltage producing means responsive both to the indication means and the presence of logic 1s in the output of the buffer for producing a ramp voltage;

comparison means for comparing the amplitude of the ramp voltage to a selected analog input voltage;

control means for freezing the propagation of logic 1s through the chain of buffers when the amplitude of the ramp voltage equals the selected analog input voltage; and code generating means for producing a digital code corresponding to the amplitude of the ramp voltage when the buffers are frozen.

11. An A/D converter, comprising:

signal means for indicating the highest one of a plurality of consecutive voltage ranges exceeded by an analog input voltage;

code generating means including a chain of buffers and the signal means for producing a thermometer code having an initial value corresponding to a maximum one of a plurality of voltage ranges exceeded by the analog input voltage, the value increasing from the initial value;

voltage producing means for producing a ramp voltage corresponding to the thermometer code;

comparison means for comparing the ramp voltage with the analog input voltage and producing a signal when they are equal; and control means responsive to said signal for freezing the thermometer code, the frozen thermometer code being a digitized representation of the amplitude of the analog input voltage at such time.

12. A method for converting an analog voltage into a digital representation thereof, comprising the following steps:

generating a thermometer code by utilizing a chain of buffers;

generating a ramp voltage corresponding to the thermometer code, wherein the ramp voltage increases as the thermometer code increases;

comparing the amplitude of the ramp voltage to the amplitude of an analog input voltage;

producing a first signal when the analog voltage and the ramp voltage have the same amplitude;

freezing the amplitude of the ramp voltage in response to the first signal; and converting the thermometer code at the time of the freezing into a binary digital representation of the analog input voltage.

13. The method according to claim 12, wherein the thermometer code is generated by the following steps:

providing a plurality of clock pulses;

providing a sample of the analog input voltage occurring at each clock pulse;

providing a reference voltage;

dividing the reference voltage into at least two contiguous ranges;

deriving a second signal indicating the voltage ranges exceeded by the voltage sample; and using a chain of buffers to provide a third signal at each successive clock pulse.

14. The method according to claim 13, wherein the ramp voltage is generated by the following steps:

coupling the second and third signals to a conversion table providing a digital signal representing the sum of the values of the second and third signals; and applying the digital signal to a D/A converter.

15. The method according to claim 14, wherein the ramp voltage is frozen by the following steps:

providing a fourth signal when the ramp voltage exceeds the analog input voltage; and freezing the buffers in response to the fourth signal.

16. An apparatus for generating a ramp voltage for comparison with an analog voltage to be digitized, comprising:

at least one comparator having an input to which an analog input voltage to be digitized is applied, and an output;

a chain of buffers;

loading means for loading a logic 1 into a first buffer in the buffer chain;

activation means for activating the loading means wherein the logic 1 propagates through the chain of buffers;

a conversion table coupled to both the output of the comparator and the chain of buffers for producing a binary digital code representing the amplitude of the sum of a range indicated by the comparator and the chain of buffers, the binary digital code being the digital representation of the analog input voltage; and a D/A converter coupled to the output of the conversion table for producing a ramp voltage.

17. A method for generating a ramp voltage for comparison with an analog voltage to be digitized, comprising the steps of:

dividing a maximum amplitude of an analog input voltage into a plurality of voltage ranges;

determining the voltage ranges the analog voltage exceeds at a given time;

initiating the propagation of a logical 1 through a chain of buffers at the given time; and deriving a ramp voltage corresponding to a highest voltage range exceeded by the analog voltage and outputs of the buffers through which the logic 1 has propagated.

18. The method according to claim 17, wherein the analog voltage is divided into a plurality of voltage ranges by the following steps:

using a voltage divider having output voltages at the maximum end of each voltage range; and comparing the output voltages with the analog voltage to determine the voltage range exceeded by the analog input voltage.

19. The method according to claim 17, wherein the ramp voltage is derived by the following steps:

applying the highest voltage range exceeded by the analog input voltage and the outputs of the buffers through which the logic 1 has propagated to a conversion table that translates a sum thereof into a binary digital code; and applying the digital code to a D/A converter.

20. A method for deriving a code representing the amplitude of an analog voltages comprising the steps of:

deriving a ramp voltage;

applying an analog voltage and the ramp voltage to an operational amplifier such that its output changes sign when the ramp voltage exceeds the analog voltage;

producing a logic 0 when the amplitude of the ramp voltage is less than the amplitude of the analog voltage, and a logic 1 when the amplitude of the ramp voltage is greater than the amplitude of the analog voltage;

freezing the passage of the logic 1 through a chain of buffers in response to the logic −1; and translating a voltage range exceeded by the analog voltage and the number of buffers through which the logic 1 has propagated when the freezing occurs into a digital code representing the amplitude of the analog voltage.

21. The method according to claim 20, wherein the code is a binary digital code.

* * * * *